(12) United States Patent
Hara et al.

(10) Patent No.: US 6,566,232 B1
(45) Date of Patent: May 20, 2003

(54) METHOD OF FABRICATING SEMICONDUCTOR DEVICE

(75) Inventors: Akitoshi Hara, Nagano-ken (JP); Eiichi Sato, Okaya (JP)

(73) Assignee: Seiko Epson Corporation, Tokyo (JP)

( * ) Notice: Subject to any disclaimer, the term of this patent is extended or adjusted under 35 U.S.C. 154(b) by 0 days.

(21) Appl. No.: 09/691,112

(22) Filed: Oct. 19, 2000

(30) Foreign Application Priority Data

Oct. 22, 1999 (JP) ............................................ 11-301439

(51) Int. Cl.[7] .................... H01L 21/44; H01L 21/48; H01L 21/50; H01L 21/46; H01L 21/30
(52) U.S. Cl. ...................... 438/455; 438/109; 438/110; 438/458
(58) Field of Search ............................... 438/106, 109, 438/110, 455, 458; 257/686

(56) References Cited

U.S. PATENT DOCUMENTS

| | | | | |
|---|---|---|---|---|
| 4,897,708 A | * | 1/1990 | Clements | 357/65 |
| 4,954,875 A | * | 9/1990 | Clements | 357/75 |
| 5,104,820 A | * | 4/1992 | Go et al. | 437/51 |
| 5,229,647 A | * | 7/1993 | Gnadinger | 257/785 |
| 5,837,566 A | * | 11/1998 | Pedersen et al. | 438/109 |
| 6,177,296 B1 | * | 1/2001 | Vindasius et al. | 438/109 |
| 6,188,129 B1 | * | 2/2001 | Paik et al. | 257/686 |
| 6,352,923 B1 | * | 3/2002 | Hsuan et al. | 438/667 |

* cited by examiner

*Primary Examiner*—Alexander Ghyka
(74) *Attorney, Agent, or Firm*—Oliff & Berridge, PLC

(57) ABSTRACT

After a silicon oxide film is formed on a semiconductor wafer, pattern formation alignment marks are provided in the chip formation areas and through-holes for stacking are formed in each chip formation area using an alignment mark as reference in order to improve accuracy in vertically stacking semiconductor chips. Next, after forming elements, wiring and electrode parts on the semiconductor wafer, the semiconductor wafer is cut along the chip formation area and is divided into semiconductor chips. Then, the divided semiconductor chips, as many as needed, are stacked by matching the through-holes.

19 Claims, 4 Drawing Sheets

METHOD OF FABRICATING SEMICONDUCTOR DEVICE

BACKGROUND OF THE INVENTION

1. Field of the Invention

The present invention relates to a method of fabricating a semiconductor apparatus, in particular, a method of fabricating a stacked multi-chip package (stacked MCP) in which a plurality of semiconductor chips are stacked in one package.

2. Description of Related Art

Recently, with a need for higher performance and smaller electronic equipment, semiconductor apparatus have become more functional and smaller through development of multi-chip package in which a plurality of semiconductor chips are placed in one package. Moreover, there are two types of multi-chip package; a flat surface MCP in which a plurality of semiconductor chips are arranged on a flat surface, and a stacked MCP in which a plurality of semiconductor chips are stacked in the direction of thickness. Contribution of a flat surface MCP, in which semiconductor chips are arranged on a flat surface, to miniaturization of electronic equipment is small because it requires large mounting area. For this reason, development of stacked MCP in which semiconductor chips are stacked is emphasized more in recent years.

In the related art, a stacked MCP was fabricated by first dividing a semiconductor wafer, in which elements are integrated, into small semiconductor chips, which are then stacked together. However, in stacking semiconductor chips, determination of relative position of semiconductor chips stacked vertically is difficult, and positioning error easily occurs. In particular, in stacking semiconductors of the same size, confirmation of position of bottom semiconductor chip with naked eyes or video image is difficult, resulting in positioning error. For this reason, in mutually and electrically connecting semiconductor chips vertically for example, through small electrode parts provided in the semiconductor chip, positioning error of the electrode parts often occurs, resulting in connection failures.

The present invention aims to resolve shortcomings of aforementioned prior art by achieving accurate vertical stacking of semiconductor chips.

In order to achieve aforementioned aim of the present invention, a first method of fabricating a semiconductor apparatus of the present invention may consist of a step for providing pattern formation alignment marks on semiconductor wafers, a step for forming through-holes for stacking at a plurality of predetermined positions in each chip formation area of the semiconductor wafers using the alignment marks as reference, a step for forming a circuit on the semiconductor wafers with the through-holes, a step for dividing the wafers with circuit into a plurality of semiconductor chips, and a step for stacking a plurality of the divided semiconductor chips by matching the through-holes for stacking which are provided on each semiconductor chip.

As commonly known, elements and wiring (circuits) are formed on a semiconductor wafer, hence, various patterns are transcribed many times using an enlargement mask (reticule). Moreover, on a semiconductor wafer in general, an oxidation film is formed by heat oxidizing the entire semiconductor wafer, after which alignment marks for pattern formation are provided by etching and the like to prevent positioning error between patterns to be transcribed.

Hence, using the pattern formation alignment marks as reference, a pair of through-holes for stacking is created on predetermined positions in a semiconductor wafer, namely a plurality of predetermined positions in areas where each semiconductor chips is formed such as diagonally opposite positions in a semiconductor chips. Then, in stacking the semiconductor chips which are formed by dividing semiconductor wafers with circuit, the semiconductor chips may be stacked accurately by matching the through-holes. For this reason, even when stacked semiconductor chips are to be connected electrically through electrode parts provided in the semiconductor chips, the positioning error of the electrode parts may be prevented and concerns for connection failure may be eliminated. Here, in stacking semiconductor chips, use of commonly known back-light method which illuminate the semiconductor chips from the bottom enables accurate identification of through-holes for stacking, making easier to match positions of through-holes.

Moreover, a second method of fabricating a semiconductor apparatus of the present invention may consist of a step for providing pattern formation alignment marks on semiconductor wafers, a step for forming through-holes for stacking at a plurality of predetermined positions in each chip formation area of the semiconductor wafers using the alignment marks as reference, a step for forming a circuit on the semiconductor wafers with the through-holes, a step for stacking a plurality of the semiconductor wafers by matching the through-holes for stacking which are provided on the semiconductor wafers, and a step for dividing the stacked semiconductor wafers in stacked condition, into a plurality of semiconductor chips.

In the second exemplary embodiment, semiconductor wafers are stacked, before dividing into semiconductor chips, by matching through-holes, then the stacked wafers are cut and divided into the size of semiconductor chips. Hence, accurate determination of mutual positions of stacked semiconductor chips is achieved just like the case of the first exemplary embodiment. Moreover, because semiconductor wafers are stacked before dividing, the number of through-holes for stacking being formed on the wafer may be reduced.

In the first and the second exemplary embodiments, the through-holes for stacking may be formed on the positions where electrode parts of the circuit being formed on the semiconductor wafers are provided. By providing through-holes on the electrode position in such manner, stacked semiconductor chips may easily be connected electrically by arranging metal such as copper and aluminum in the through-holes through electroless plating and spattering, or by filling the holes with conductive adhesive agent, which results in simplification of the process. Moreover, the elements in the wall surface of the through-holes are oxidized during the formation stage, which eliminates need for special insulation treatment of the through-holes.

Furthermore, the through-holes for stacking may be formed on the positions where the active surface and the non-active surface of the semiconductor wafers are electrically connected. In fact, when a front surface (active surface) and a back surface (non-active surface) of a semiconductor chip are electrically connected, such as in grounding, by forming through-holes for stacking at a position where a front surface and the back surface are connected electrically and by arranging conductive material in the through-holes after stacking by matching the through-holes, conductivity between front surface and the back surface of the semiconductor chip may be easily achieved in addition to the accurate stacking of semiconductor chips.

Moreover, a third exemplary embodiment of a method of fabricating a semiconductor apparatus of the present invention may consist of a step for forming a circuit on semiconductor wafers, a step for forming through-holes for stacking on a plurality of electrode parts in the circuit being formed on the semiconductor wafers, a step for stacking a plurality of the semiconductor wafers by matching the through-holes for stacking being provided in the semiconductor wafers and for mutually bonding stacked semiconductor wafers by injecting conductive adhesive agents inside the through-holes for stacking, and a step for dividing the plurality of bonded semiconductor wafers into the size of the semiconductor chips. In this exemplarly embodiment also, because of stacking by matching through-holes, the accuracy in stacking semiconductor chips may be improved. Moreover, injection of conductive adhesive agent into through-holes enables simultaneous execution of mutual bonding of semiconductor wafers and mutual electrical connection of semiconductor chips, resulting in process simplification.

DETAILED DESCRIPTION OF THE PREFERRED EMBODIMENTS

Hereafter, detailed description of the preferred exemplary embodiments for the semiconductor apparatus fabrication method of the present invention.

FIGS. 1(a)–(d) illustrate the semiconductor apparatus fabrication method in the first exemplary embodiment of the present invention.

Figure 1A:
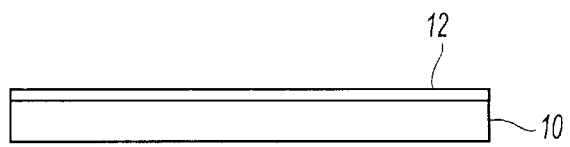
FIGS. 1(a)–(d) show a partial illustration of the processes which explain the semiconductor apparatus fabrication method of the first exemplary embodiment of the present invention.
Figure 1B:
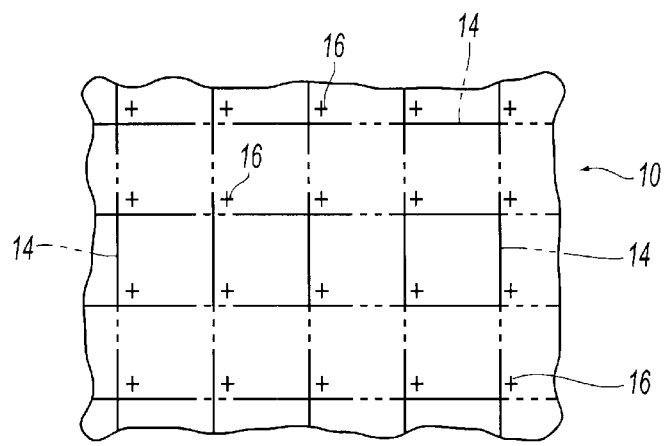

First, a silicon semiconductor wafer is prepared in a same manner as a case of normal semiconductor chip, and a silicon oxidation film 12 consisting of silicon dioxide ($SiO_2$) is formed on he surface of the semiconductor wafer 10 by heat oxidizing the semiconductor wafer 10 as shown in FIG. 1(a). Next, at the predetermined position of the semiconductor wafer 10 (silicon oxidation film 12) such as at bottom left corner of each chip formation area 14 of the semiconductor wafer 10 as shown in FIG. 1(b), pattern formation alignment marks 16 for transcribing circuit patter are formed by means of etching and the like, similar to method used in prior art.

Figure 1C:
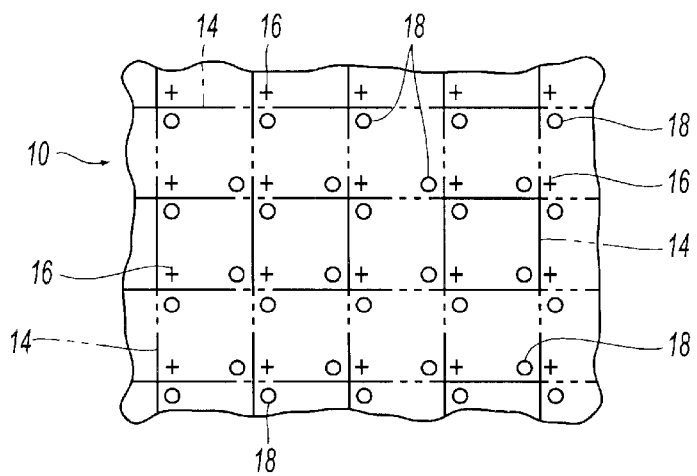

Then a plurality of through-holes 18 for stacking are formed at the predetermined positions in the semiconductor wafer, as shown in FIG. 1(c), using an arbitrary alignment mark 16 as reference. In the present exemplary embodiment, two through-holes for stacking 10 are formed, one each on two diagonal comers in each chip formation area 14. Moreover, the through-holes 18 may be formed by etching or by laser beam.

Figure 1D:
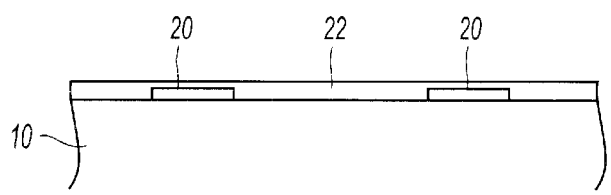

Next, in a manner similar to methods in prior art, elements such as transistors, resistors and wiring connecting each element constituting a circuit on the semiconductor chip 10 (none are represented) are formed, at the same time, as shown in FIG. 1(d), and electrode parts 20 are formed for external connection. Moreover, a passivation film 22 made of insulation material such as phosphate glass (PSG) is provided in the entire top section of the semiconductor wafer 10 covering the electrode parts 20.

Figure 2A:
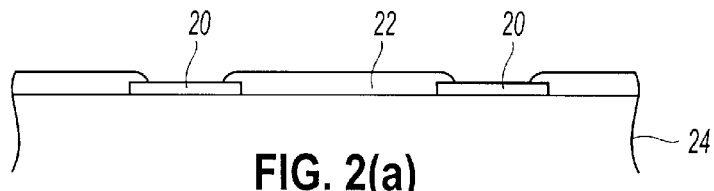
FIGS. 2(a)–(d) show an illustration of the process which follows the FIGS. 1(a)–(d) of the first exemplary embodiment.
Figure 2B:
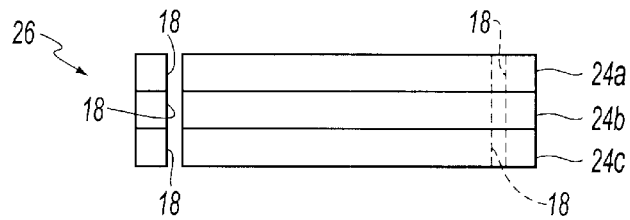

Then the semiconductor wafer 10 is divided into a plurality of semiconductor chips by cutting the wafer at each chip formation area 14. Moreover, as shown in FIG. 2(a), the passivation film 22 on the electrode parts 20 in each divided semiconductor chip 24 is removed by etching to expose the electrode part 20. Furthermore, desired number of semiconductor chips 24 (three semiconductor chips 24a–24c in the present exemplary embodiment) are stacked by matching the through-hole 18 in the semiconductor chips 24, as shown in FIG. 2(b), which three semiconductor chips 24a–24c are made into a stacked unit 26 by mutually bonding using unrepresented adhesive agent. In the present exemplary embodiment, in this manner, the semiconductor chips 24 are stacked by matching the through-hole 18, hence, positioning of each semiconductor chip 24 to be stacked is easily accomplished, resulting in increased accuracy of the stacking.

Moreover, if unrepresented light source is arranged under the through-hole 18 in stacking, the positioning of the through-hole 18 becomes even easier.

Figure 2C:
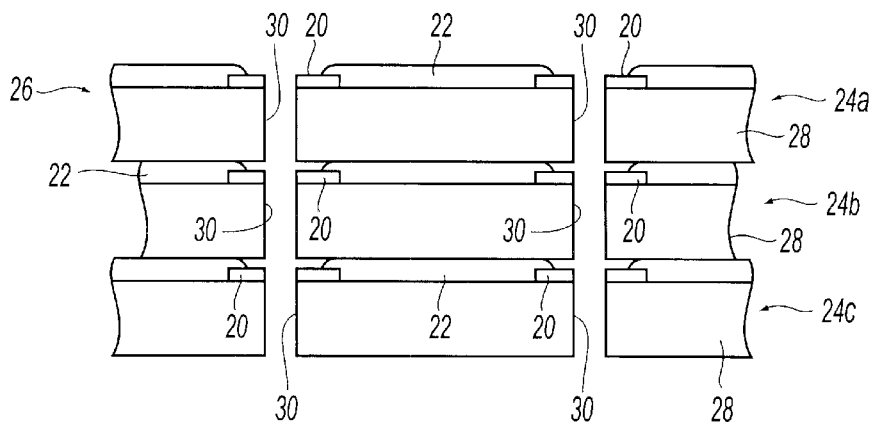
Figure 2D:
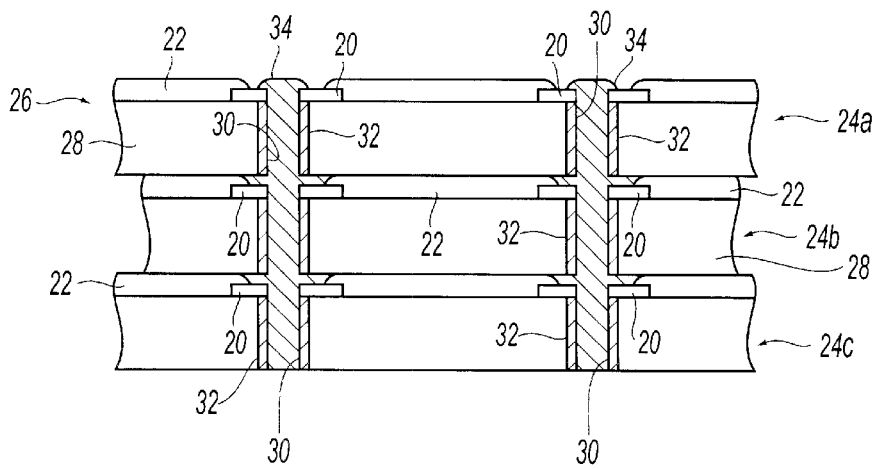

In the present exemplary embodiment, each semiconductor chip 24 is stacked in such a manner that electrode part 20 correspond to each other as shown in FIG. 2(c). Moreover, each semiconductor chip 24 of the stacked unit 26 will have connection hole 30 created, in stacked state, by laser beam and the like penetrating the electrode part 20 and the substrate part 28 made of silicone. Then, as shown in FIG. 2(d), heat oxidation treatment or oxidation through immersion in concentrated nitric acid is executed on the stack unit 26 in the oxidation atmosphere to form insulation film 32 made of silicon oxide on the substrate part 28 which forms the wall surface of the connection hole 30 in each semiconductor chip. After removing oxidation film being formed at the electrode parts 20 by alkaline solution and the like, a conductive adhesive agent 34 is injected into the connection hole 30 of the stacked unit 26, and the electrode part 20 of each semiconductor chip 24 is electrically connected each other. The stacked unit 26 with its respective semiconductor chip 24 electrically connected is mounted onto unrepresented package substrate, resin-sealed and made into stacked MCP, a semiconductor apparatus.

In aforementioned exemplary embodiment, description is given for a case in which a semiconductor wafer is divided into a plurality of semiconductor chips 24, which, in turn, are stacked, but it is also permissive to remove first passivation film 22 of the electrode part 20 in the semiconductor wafer 10 and to stack the semiconductor wafer 10, after which the stacked semiconductor wafer 10 is divided into the size of the semiconductor chips. In this case, it is unnecessary to provide through-holes 18 for stacking in each chip formation area 14, but 2–3 holes may be provided per semiconductor wafer 10.

Moreover, connection holes 30 may be formed in a stacked semiconductor wafer 10, or may be formed after the wafer is cut into the size of semiconductor chips. Furthermore, electrical connection of the electrode parts 20 with semiconductor chips 24 may be achieved by providing, by means of electroless plating, conducting metal such as copper. Moreover, in aforementioned exemplary embodiment, description is given for a case in which through-holes 18 are provided at diagonal corners of the chip formation area 14, but the holes may be provided at non-diagonal corners and the number of holes may be three or more.

Figure 3A:
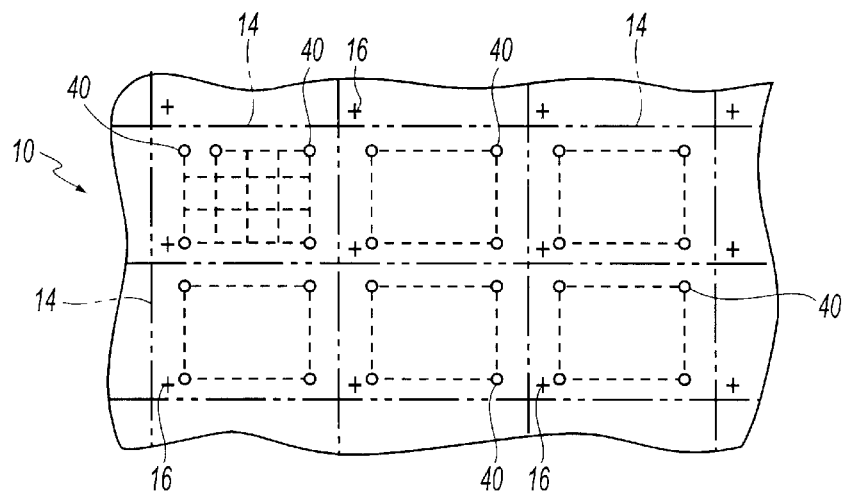
FIGS. 3(a)–(e) show a partial illustration of the processes which explain the semiconductor apparatus fabrication method of the second exemplary embodiment of the present invention.

FIGS. 3(a)–(e) show an illustration of the second exemplary embodiment. On the semiconductor wafer 10, as in the case of aforementioned exemplary embodiment, a silicon oxidation film is formed, after which pattern formation alignment marks 16 are formed in the chip formation areas 14, as shown in FIG. 3(a). Then, a plurality of through-holes for stacking are formed at the respective predetermined position of each chip formation area 14 using an alignment mark 16 as a reference. These through-holes 40 correspond to the position of the electrode for external connection of the semiconductor chip which is created by dividing the semiconductor wafer 10.

Figure 3B:
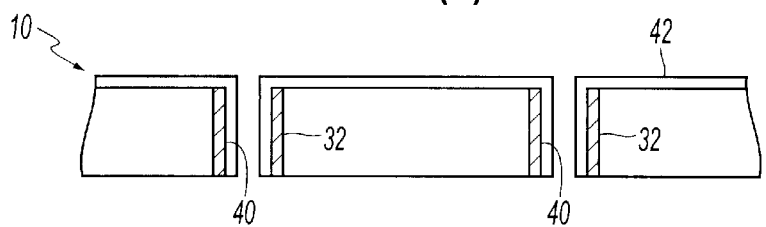
Figure 3C:
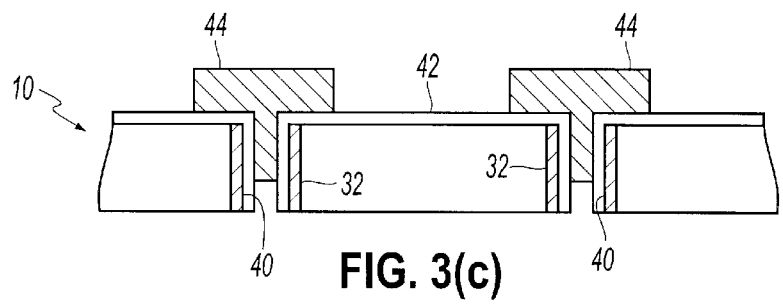

Next, elements such as transistor, capacitors and resistors, together with a wiring pattern are formed on the semiconductor wafer with through holes 40 in the same manner as forming normal semiconductor chips. Then, a section of the semiconductor wafer 10 forming a wall surface of the through-holes 40 is oxidized by heat treatment at the time of forming element isolation area (not shown), which becomes an insulated film 32 made of silicon oxide as shown in FIG. 3(b).

Next, an insulation layer (not shown) is formed on the wiring pattern of the semiconductor wafer 10 on which elements and wiring are provided, on top of which insulation layer a metal film 42 consisting of aluminum is deposited for formation of the electrode part. Then, patterning is done by a coating photo resist on the metal film 42 and a resist film 44 consisting of a residual photo resist is formed at the position where the electrode part is to be provided. Here, the resist film 44 is formed with the through-holes 40 covered by coating with a photo resist with high viscosity.

Figure 3D:
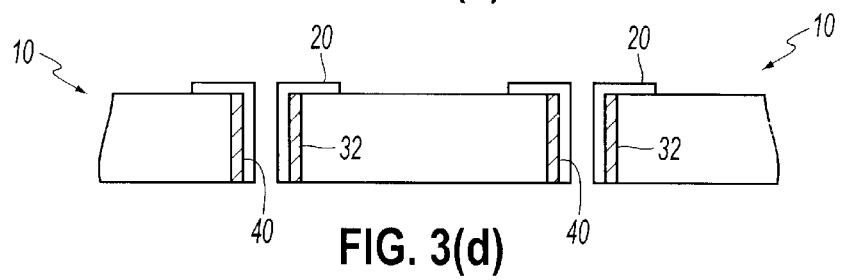
Figure 3E:
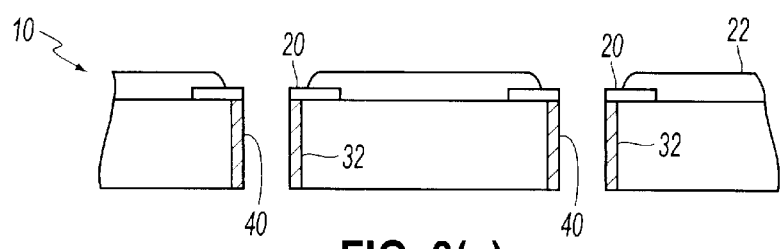

Next, the metal film 42 is etched using the resist film 44 as a mask, an electrode part 20 with a hole is formed as shown in FIG. 3(d), and the resist film 44 is removed. As shown in the figure, a portion of the metal film forming the electrode part 20 covers the wall surface of the through-hole 40. Hence, after forming the electrode part 20 and removing the resist film 44, the metal film in the through-hole 40 is removed by laser beam as shown in FIG. 3(e). Then, as in the case of aforementioned exemplary embodiment, a passivation film 22 is formed on the semiconductor wafer 10, which then is etched to expose electrode part 20.

Figure 4:
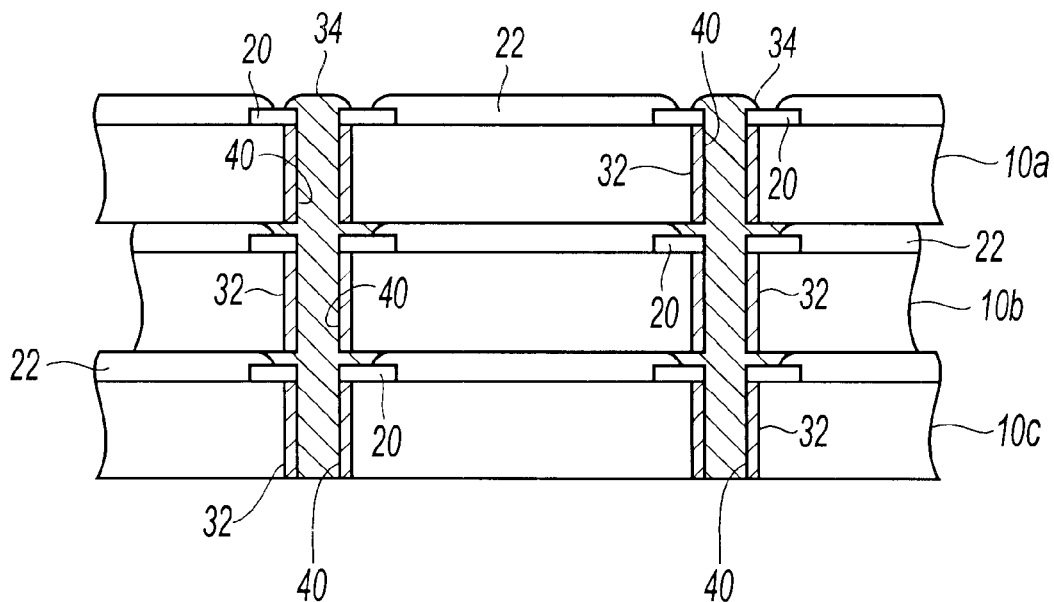
FIG. 4 is an illustration of the process which follows the FIGS. 3(a)–(e) of the second exemplary embodiment.

Next, a desired number of semiconductor wafers 10 with exposed electrode parts 20 are stacked by matching through-holes 40 penetrating through the electrode parts 20 as shown in FIG. 4. Then, a conductive adhesive agent 34 is injected and hardened in the through-holes 40 for stacking to electrically connect electrode parts 20 of each semiconductor wafer 10 (10a–10c) and to mutually bond stacked wafers 10. The stacked semiconductor wafers 10 are divided into the size of the semiconductor chips for packaging.

As explained above, in the second exemplary embodiment, through-holes 40 for stacking are formed at the positions where electrode parts 20 are to be provided in the semiconductor wafer, hence, the accuracy in the stacking of semiconductor chips is improved. At the same time, the process is simplified owing to formation of the insulation film 32 in the wall surface of through-holes 40 during a process of providing elements in the semiconductor wafer.

Incidentally, in the second exemplary embodiment, description is given of a case in which elements and electrode parts 20 are formed after creating through-holes 40, but it is equally permissible to form elements, wiring, electrode parts 20 and passivation film 22 first, followed by removal of the passivation film 22 on the electrode part 20, after which through-holes 40 are created by laser beam and the like, and finally the semiconductor wafers 10 are stacked.

Figure 5:
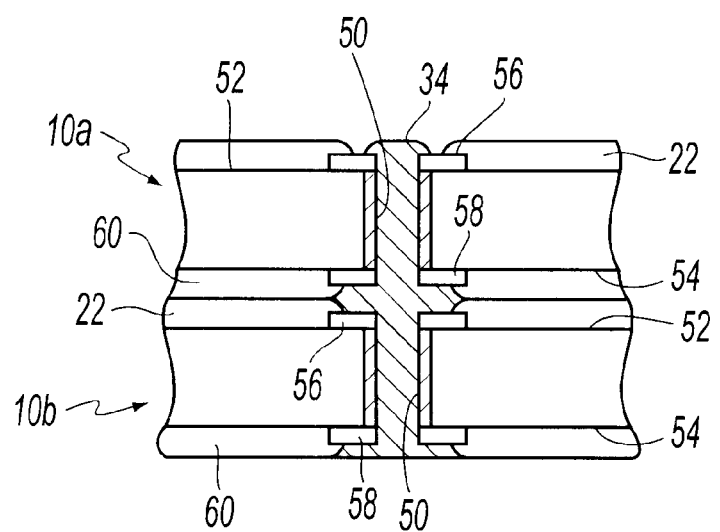
FIG. 5 is an illustration for the third exemplary embodiment of the present invention.

FIG. 5 is an illustration of the third exemplary embodiment. In the third exemplary embodiment, the through-holes 50 are formed at the positions where the active surface 52 (front surface) and the non-active surface (back surface) 54 of the semiconductor wafer 10 are to be connected electrically (conductive connection) such as in ground wiring.

These through-holes 50 are formed, using alignment marks as reference, at the predetermined positions in the chip formation areas, after forming the pattern formation alignment marks as in the case of aforementioned exemplary embodiment. Then, after formation of elements and wiring on the semiconductor wafer 10 in a manner similar to aforementioned exemplary embodiment, common electrode parts 56 for grounding, for example, may be formed at the positions where through-holes 50 are provided in the active surface 52, and connection electrode parts 58 corresponding to the common electrode parts 56 are formed in the non-active surface 54. These connection electrode parts 58 are formed with unshown ground wiring, for example, which are provided in the non-active surface 54. Moreover, an insulation film 60 is formed covering the wiring and the connection electrode parts 58 in the non-active surface 54. A section of the insulation film 60 covering the connection electrode parts 58 is to be removed. A plurality of semiconductor wafers 10 are then stacked by matching the through-holes 50. Next, a conductive adhesive agent 34 is injected into through-holes 50, which electrically connect the common electrode part 56 and the connection electrode parts 58 of each semiconductor wafer 10, and the common electrode parts 56 and the connection electrode parts 58 of each semiconductor wafer 10 are mutually and electrically connected through the conductive adhesive agent 34. Hence, conductivity between active surface 52 and non-active surface 54 of the semiconductor wafer 10 is established easily and surely without use of wire and the like.

Possibility of Industrial Application

As described above, in the present invention, through-holes for stacking are formed at predetermined positions of a semiconductor wafer, namely a plurality of predetermined positions in the areas where each semiconductor chip is formed, using pattern formation alignment marks being provided in the semiconductor wafer as reference, and in stacking semiconductor chips, after forming a circuit in the semiconductor wafer and dividing the semiconductor wafer into semiconductor chips, the through-holes are matched to enable accurate stacking of the semiconductor chips, and even in connecting mutually and electrically the semiconductor chips through the electrode parts provided in the semiconductor chips, the positioning error of the electrode parts is prevented and problems such as connection failure may be avoided.

Moreover, in the present invention, the number of through-holes to be provided in the semiconductor wafer may be reduced by stacking a plurality of semiconductor wafers by matching the through-holes being provided in the semiconductor wafer and by dividing stacked wafer into the size of the semiconductor chips.

What is claimed is:

1. A method of fabricating a semiconductor apparatus, comprising the steps of:
   forming first through-holes penetrating a semiconductor wafer;
   forming circuits in said semiconductor wafer after forming said first through-holes;
   dividing said semiconductor wafer into first semiconductor chips each having said first through-holes; and
   disposing said first semiconductor chip on a second semiconductor chip which has second through-holes penetrating said second semiconductor chip by matching said first through-holes and said second through-holes.

2. A method of fabricating a semiconductor apparatus, comprising the steps of:
   forming first through-holes penetrating a first semiconductor wafer;
   forming circuits in said semiconductor wafer;
   disposing said first semiconductor wafer, said first semiconductor wafer including first semiconductor chips on a second semiconductor wafer which has second through-holes penetrating said second semiconductor wafer by matching said first through-holes on said second through-holes, said second semiconductor wafer including second semiconductor chips; and
   dividing said first semiconductor wafer and said second semiconductor wafer into first semiconductor chips which are disposed on said second semiconductor chips.

3. The method of fabricating a semiconductor apparatus of claim 1, said first semiconductor chips having electrodes thereon, and said first through-holes being formed at positions where said electrodes electrically connecting to said circuits are formed.

4. The method of fabricating a semiconductor apparatus of claim 1, each of said first semiconductor chips having a first surface and a second surface, said through-holes being formed at positions where first electrodes disposed on said first surface and second electrodes disposed on said second surface are connected electrically.

5. A method of fabricating a semiconductor apparatus, comprising the steps of:
   forming circuits on semiconductor wafers;
   forming through-holes in said semiconductor wafers;
   stacking a plurality of said semiconductor wafers by matching said through-holes, and mutually bonding stacked semiconductor wafers by injecting conductive adhesive agents inside the through-holes; and
   dividing said plurality of bonded semiconductor wafers into semiconductor chips having said circuits.

6. A semiconductor apparatus fabricated by the method of fabricating a semiconductor apparatus described in claim 1.

7. The method of fabricating a semiconductor apparatus of claim 2, said first semiconductor wafer having electrodes thereon, and said first through-holes being formed at positions where said electrodes electrically connecting to said circuits are formed.

8. The method of fabricating a semiconductor apparatus of claim 2, each of said first semiconductor chips having first surface and second surface, said through-holes being formed at positions where first electrodes disposed on said first surface and second electrodes disposed on said second surface are connected electrically.

9. A semiconductor apparatus fabricated by the method of fabricating a semiconductor apparatus described in claim 2.

10. A semiconductor apparatus fabricated by the method of fabricating a semiconductor apparatus described in claim 5.

11. The method of fabricating a semiconductor apparatus of claim 1, further comprising the step of:
    providing alignment marks on said semiconductor wafer before said step of forming said first through-holes penetrating said semiconductor wafer,
    wherein said first through-holes are formed by using said alignment marks as reference at said step of forming said first through-holes.

12. The method of fabricating a semiconductor apparatus of claim 2, further comprising the step of:
    providing alignment marks on said first semiconductor wafer before said step of forming said first through-holes penetrating said first semiconductor wafer,
    wherein said first through-holes are formed using said alignment marks as reference at said step of forming said first through-holes.

13. The method of fabricating a semiconductor apparatus of claim 1, wherein the first through-holes have insulation films therein, said insulation films are formed at said step of forming circuits in said semiconductor wafer.

14. The method of fabricating a semiconductor apparatus of claim 2, wherein the first through-holes have insulation films therein, said insulation films are formed at said step of forming circuits in the first semiconductor wafer.

15. The method of fabricating a semiconductor apparatus of claim 2, wherein said step of forming circuits in said first semiconductor chips having circuits is after said step of forming first through-holes in said first semiconductor wafer.

16. The method of fabricating a semiconductor apparatus of claim 2, wherein said step of forming circuits in said semiconductor chips having circuits is before said step of forming first through-holes in said first semiconductor wafer.

17. A method of fabricating a semiconductor apparatus, comprising the steps of:
    forming first through-holes penetrating a semiconductor wafer;
    forming circuits in said semiconductor wafer;
    dividing said semiconductor wafer into first semiconductor chips, each of said first semiconductor chips having said first through-holes; and
    disposing said first semiconductor chips on second semiconductor chips which have second through-holes penetrating said second semiconductor chips by matching said first through-holes and said second through-holes.

18. The method of fabricating a semiconductor apparatus of claim 17, wherein said step of forming said circuits in the semiconductor wafer is before the step of forming said first through-holes in said semiconductor wafer.

19. The method of fabricating a semiconductor apparatus of claim 17, wherein said step of forming said circuits in said semiconductor wafer is after said step of forming said first through-holes in said semiconductor wafer.

* * * * *